United States Patent [19]

Murakami

[11] Patent Number: 5,506,447
[45] Date of Patent: Apr. 9, 1996

[54] HYBRID INTEGRATED CIRCUIT

[75] Inventor: Tadayoshi Murakami, Kawasaki, Japan

[73] Assignee: Fuji Electric Co., Ltd., Kawasaki, Japan

[21] Appl. No.: 257,330

[22] Filed: Jun. 7, 1994

[30] Foreign Application Priority Data

Jun. 15, 1993 [JP] Japan ................................. 5-142411

[51] Int. Cl.⁶ ........................... H01L 23/48; H01L 23/52
[52] U.S. Cl. ........................ 257/690; 257/762; 257/747; 257/693; 257/696; 257/706; 257/753; 257/707; 257/773; 361/773; 361/779; 361/771; 361/772
[58] Field of Search ................................. 257/762, 747, 257/735, 693, 690, 696, 706, 748, 753, 773, 701, 723, 707, 724; 361/773, 779, 764, 771, 772

[56] References Cited

FOREIGN PATENT DOCUMENTS

| | | | |
|---|---|---|---|
| 213791A | 9/1984 | German Dem. Rep. | 257/747 |
| 55-70056 | 5/1980 | Japan | 257/762 |
| 60-15937 | 1/1985 | Japan | 257/762 |
| 61-139054 | 6/1986 | Japan | 257/723 |
| 62-35658 | 2/1987 | Japan | 257/690 |

*Primary Examiner*—Jerome Jackson, Jr.
*Assistant Examiner*—John Guay
*Attorney, Agent, or Firm*—Kanesaka & Takeuchi

[57] ABSTRACT

A hybrid integrated circuit of the invention is formed of an insulation substrate, a thick film conductor printed and sintered on the insulation substrate, and a terminal conductor and a circuit part connected to the first thick film conductor. A first electrically conductive metal plate is brazed on the first thick film conductor and connects the circuit part and the first terminal. Electric current between the circuit part and the first terminal mostly flows through the metal plate.

4 Claims, 4 Drawing Sheets

(b)

HYBRID INTEGRATED CIRCUIT

BACKGROUND OF THE INVENTION AND RELATED ART STATEMENT

The present invention relates to a hybrid integrated circuit (hereinafter referred to as hybrid IC), wherein a circuit part, such as a semiconductor element or the like, is mounted on a printed circuit board formed by printing an electrically conductive thick film on an insulation substrate.

The printed circuit board that employs the thick film conductor is widely used in the hybrid ICs, since the board is fabricated easily by screen printing a circuit with a desired pattern.

FIG. 2 shows a hybrid IC comprising a ceramic insulation substrate 1 on which patterns of Ag-Pd alloy conductors 21 and 22 are printed. On one of the thick film conductor 21, a chip 4 for a semiconductor element is mounted by means of solder 5 through a copper heat sink 3. A terminal lead 6 of a covered wire is connected by solder 5 to another thick film conductor 22. The semiconductor chip 4 is connected to the terminal lead 6 by soldering an electrode of the semiconductor chip 4 to a connecting conductor 7, which is soldered to the thick film conduct 22.

FIG. 3 shows another hybrid IC for mounting individual elements. In the figure, a semiconductor element 41 is fixed to the Ag-Pd thick film conductor 21 through the solder 5, and terminal leads 61 and 62 are soldered to the conductors 21 and 22, respectively.

In case electricity flows through the Ag-Pd conductor of the hybrid ICs as shown in FIGS. 2 and 3, the sheet resistivity of the Ag-Pd conductor is from 25 to 40 milliohm, which is higher than that of the copper foil. Thus, as a current becomes large, heat generation from the Ag-Pd conductor becomes large to cause a problem of temperature rising. When more than 10A of a current flows through the Ag-Pd conductor, the conductor may burn out.

If the width of the Ag-Pd conductor is increased to reduce the resistance, the area occupied by the conductor increases to increase the size. If the thickness of the Ag-Pd conductor is increased the resistance is reduced, but it increases cost since the conductor contains precious metals and printing for the conductor must be made repeatedly.

An object of the present invention is to obviate the above problems and to provide a highly reliable, small and low cost hybrid IC, wherein in case a circuit element is mounted on a printed circuit board using an Ag-Pd thick film conductor or the like and a large current flows through the thick film conductor, the thick film conductor does not burn.

SUMMARY OF THE INVENTION

The object of the present invention is achieved by a hybrid integrated circuit, which comprises an insulation substrate; a thick film conductor printed and sintered on the insulation substrate; and a circuit part and a terminal conductor brazed on the thick film conductor to constitute the circuit, wherein a connection to the thick film conductor is made through a conductive metal plate brazed on the thick film conductor. Namely, the circuit part and the terminal conductor are generally directly connected through the conductive metal plate.

The thick film conductor is preferably made of a silver-palladium alloy, and the metal plate is preferably made of copper. Also, it is preferable that the circuit part is an unsealed semiconductor element, and the metal plate is connected at one end to an electrode disposed on the surface of the unsealed semiconductor element to constitute a part of a conductive member.

Also, the metal plate may be bent at a portion not brazed to the thick film conductor to constitute a terminal conductor, which preferably has a hole in its end portion. Further, the circuit part may be preferably an element with a lead, which is brazed with the metal plate. Also, in case the circuit part is a semiconductor element, it is advantageous to fix on both surfaces thereof metal plates having thermal expansion coefficient similar to that of the semiconductor element.

The hybrid integrated circuit may further comprise a second thick film conductor printed and sintered on the insulation substrate; a second electrically conductive metal plate brazed on the second thick film conductor; and a second terminal conductor brazed to the second electrically conductive metal plate.

The circuit part may be an individual element having a lead connected to the second metal plate. The second thick film conductor is preferably made of a silver-palladium alloy, and the second metal plate is preferably made of copper. An end of the second metal plate not connected to the second thick film conductor may be bent to constitute a second terminal conductor.

On the thick film conductor with high sheet resistivity, a good conductive metal plate such as copperplate, the resistance of which is less than $1/25$ of the thick film conductor, is fixed, so that most of the current flows through the metal plate. Only several percent of the current flows through the thick film, and heat dissipation from the thick film conductor is reduced to prevent the thick film conductor from rising temperature. Thus, reliability is increased. Also, increase of parts is avoided by commonly employing the metal plate as the terminal lead and the heat sink and by brazing the metal plate directly to an unsealed semiconductor element.

BRIEF DESCRIPTION OF THE DRAWINGS

FIGS. 9(a) and 9(b) schematically show a structure of a sixth embodiment of the present invention, in which FIG. 9(a) is a sectional view and FIG. 9(b) is a part of a side view;

DETAILED DESCRIPTION OF PREFERRED EMBODIMENTS

Figure 2:
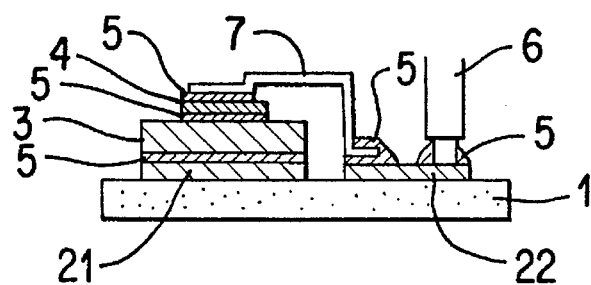
FIG. 2 is a section view schematically showing a structure of a hybrid IC of the prior art.
Figure 3:
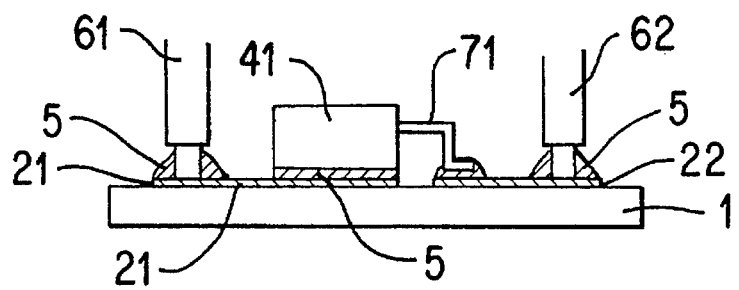
FIG. 3 is a section view schematically showing a structure of a hybrid IC of the prior art.

Now the present invention will be described in detail hereinafter with reference to the accompanied drawings which illustrate preferred embodiments of the present invention. In the drawings including FIGS. 2 and 3, like parts are designated by the same reference numerals.

Figure 1:
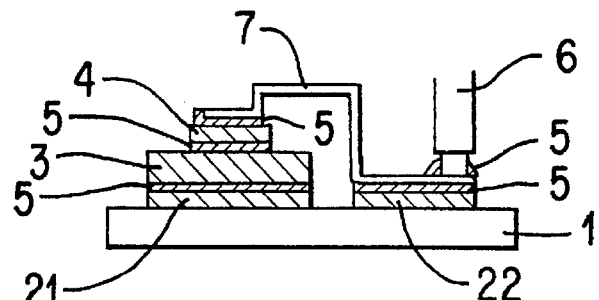
FIG. 1 is a section view schematically showing a structure of a hybrid IC of a first embodiment of the present invention.

FIG. 1 is a sectional view showing an embodiment according to the present invention. In FIG. 1, a bare chip 4 of 10 mm×10 mm in an area and 0.25 mm in thickness is fixed by solder 5 to a connecting conductor 7 of a copper strip of 2 mm in width and 0.5 mm in thickness. The conductor 7, with the width of 2 mm, is soldered on a thick film conductor 22 of 2 mm in width and 10 mm in length. A terminal lead 6 is brazed by solder 5 to the conductor 7.

In this structure, a current from the terminal lead 6 to the chip 4 flows substantially through the conductor 7, not through the Ag-Pd thick film conductor 22 with higher sheet resistivity. In a thick film conductor 21, temperature does not rise, since a heat sink 3 is brazed on the conductor 21.

Figure 4:
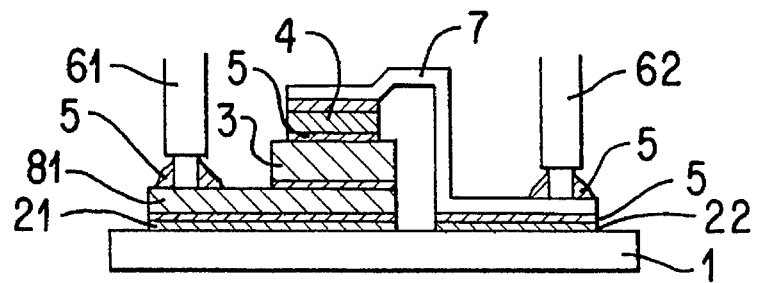
FIGS. 4–6 are section views schematically showing structures of second to fourth embodiments of the present invention.

FIG. 4 is a sectional view showing the second embodiment according to the present invention. In FIG. 4, a copper plate 81 of 1 mm in thickness is fixed by soldering also on the Ag-Pd thick film conductor 21, and the heat sink 3 is soldered on the copper plate 81. A terminal lead 61 is soldered on an end portion of the copper plate 81, which suppresses a current flowing through the thick film conductor 21, so that temperature rise of the thick film conductor 21 is prevented. A terminal lead 62 is also soldered on an end portion of the conductor 7.

Figure 5:
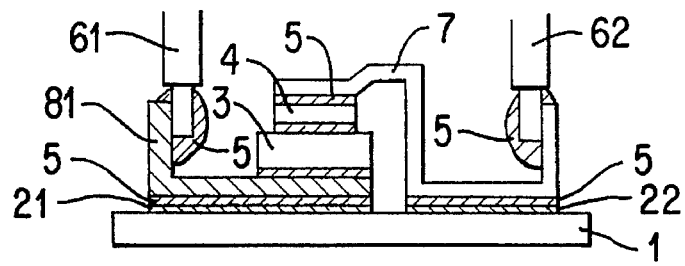

FIG. 5 is a sectional view showing the third embodiment according to the present invention. In FIG. 5, a copper plate 81 is bent upwardly at an end portion and is connected to the terminal lead 61 at the end portion. Also, the connecting conductor 7 is bent upwardly at an end portion and is connected to the terminal lead 62 at the end portion.

Figure 6:
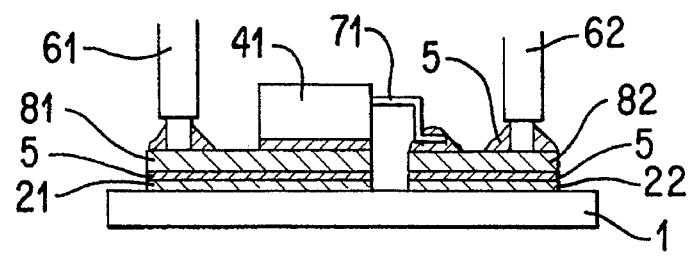
Figure 7:
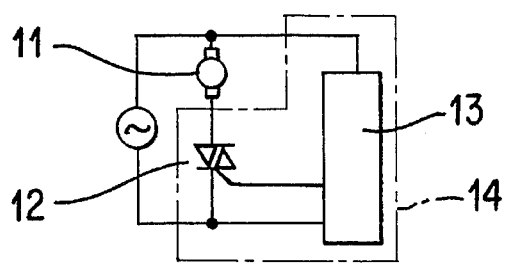
FIG. 7 is a circuit diagram of the embodiment of the hybrid IC of the present invention.

FIG. 6 is a sectional view showing the fourth embodiment according to the present invention. In FIG. 6, a copper plate 82 is soldered also on the thick film conductor 22, and a lead wire 71 of an individual element 41 like a triac is soldered to the copper plate 82. Accordingly, for example as shown in FIG. 7, when an AC motor 11 is connected to a hybrid IC 14 containing a triac element 12 and a control circuit 13, the individual element 41 (the triac element 12) having fine lead wires is connected with low resistance to the input-output lead 62.

Figure 8:
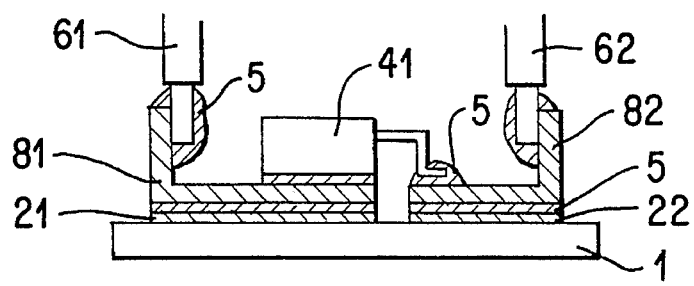
FIG. 8 is a section view schematically showing a structure of a fifth embodiment of to the present invention.

FIG. 8 is a sectional view showing the fifth embodiment according to the present invention. In FIG. 8, end portions of copper plates 81 and 82 are bent upward, and are then connected to the terminal leads 61 and 62 respectively, similar to FIG. 5.

Figure 9A:
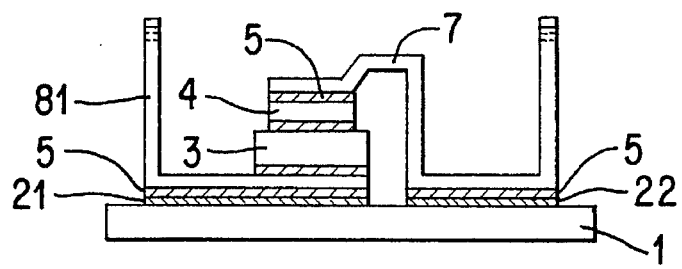
Figure 9B:
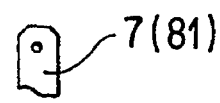
Figure 10:
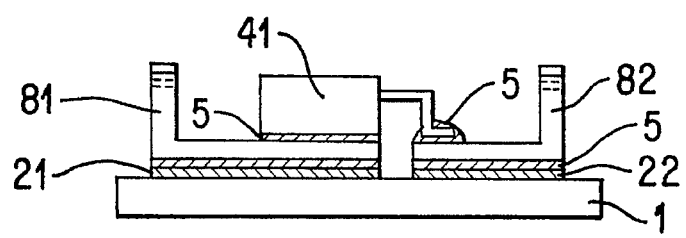
FIGS. 10–13 are section views schematically showing structures of seventh to tenth embodiments of the present invention.

In the sixth embodiment shown in FIGS. 9(a) and 9(b), end portions of the copper plate 81 and the connecting conductor 7 are formed in a shape of the Faston plug terminal, to facilitate connection with an outside device by a contact without employing soldering. In the seventh embodiment shown in FIG. 10, end portions of the copper plates 81 and 82 are formed in the shape of the Faston plug terminal to connect with an outside device by a contact, as in the embodiment of FIGS. 9(a) and 9(b).

Figure 11:
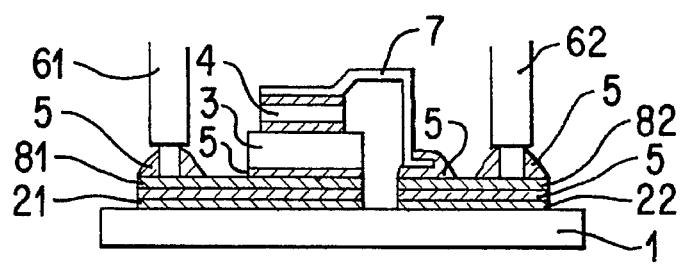

FIG. 11 is a sectional view showing the eighth embodiment of the hybrid IC of the present invention, which employs the copper plate 82 fixed on the thick film conductor 22 for the bare chip 4 of FIG. 4.

Figure 12:
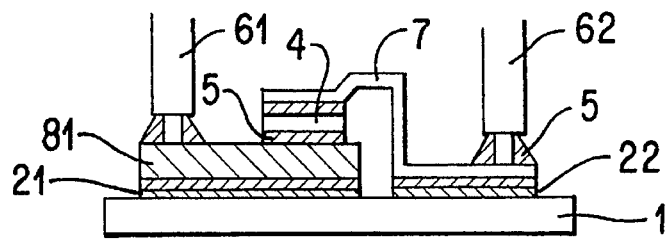

FIG. 12 is a sectional view showing the ninth embodiment of the present invention, which employs the copper plate 81 as a heat sink and eliminates the heat sink 3 from the hybrid IC of FIG. 4.

Figure 13:
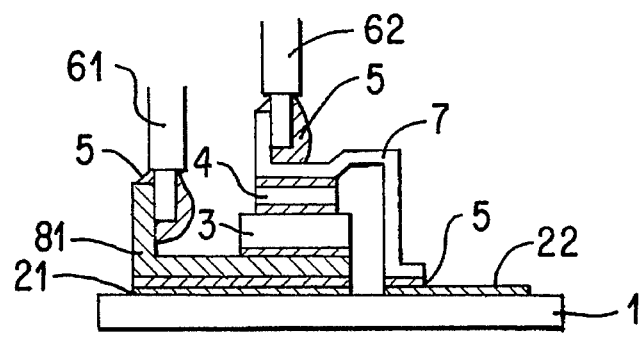

In the tenth embodiment shown in FIG. 13, a lower electrode of the chip 4 is soldered to the copper plate 81 through the heat sink 3, similarly to the embodiment of FIG. 5, and the copper plate 81 and the terminal lead 61 are connected to each other in the bent portion of the copper plate 81 by soldering. An upper electrode of the chip 4 is connected to the connecting conductor 7 by solder 5. One end portion of the connecting conductor 7 is connected to the thick film conductor 22, while the other end portion of the connecting conductor 7 projects upwardly above the chip 4 and is connected to the terminal lead 62.

Figure 14:
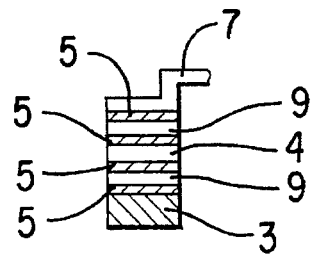
FIG. 14 is a section view schematically showing a structure of the semiconductor chip and its vicinity in an eleventh embodiment of the present invention.

FIG. 14 is a sectional view showing the eleventh embodiment of the present invention, which avoids direct connection from the bare chip 4 for a hybrid IC to the heat sink 3 and the connecting conductor 7. The bare chip 4 is connected to the heat sink 3 and the connecting conductor 7 through molybdenum plates 9, the thermal expansion coefficient of which is approximately the same as that of the chip 4. The employment of the molybdenum plate 9 improves thermal fatigue. The thermal fatigue may also be improved by connecting the chip 4 to the copper plate 81 as in the same manner.

As explained above, according to the present invention, an electrically conductive metal plate is brazed to a thick film conductor with high sheet resistivity to thereby flow most part of an electric current through the metal plate, so that temperature rise of the thick film conductor is prevented and highly reliable hybrid ICs are obtained. In the hybrid ICs of the present invention, the width or thickness of the thick film conductor need not be increased and the metal plate can be commonly used as a heat sink or a terminal lead, so that it does not increase cost and size of the hybrid ICs.

While the invention has been explained with reference to the specific embodiments of the invention, the explanation is illustrative and the invention is limited only by the appended claims.

What is claimed is:

1. A hybrid integrated circuit comprising:

an insulation substrate, first and second thick film conductors printed and sintered on said insulation substrate, first and second metal plates fixed onto the first and second thick film conductors, respectively, said second metal plate including a portion bent from and not brazed to said second thick film conductor, a circuit part including a semiconductor element and a lead, said semiconductor element being mounted on said second metal plate, said lead being connected to said first metal plate, a first terminal conductor directly connected to the first metal plate, and a second terminal conductor directly connected to the second metal plate, said portion of the second metal plate constituting the second terminal conductor so that current does not substantially flow through the first and second thick film conductors.

2. The hybrid integrated circuit as claimed in claim 1, wherein said first metal plate includes a portion bent from and unbrazed to said first thick film conductor, said portion of said first metal plate constituting the first terminal conductor.

3. The hybrid integrated circuit as claimed in claim 2, wherein said portion of said first metal plate forming said first terminal conductor includes a hole in an end portion thereof.

4. A hybrid integrated circuit comprising:

an insulation substrate, first and second thick film conductors printed and sintered on said insulation substrate, first and second metal plates fixed onto the first and second thick film conductors, respectively, a circuit part including a semiconductor element and a lead, said semiconductor element being mounted on said second metal plate, said lead being connected to said first metal plate, a first terminal conductor directly connected to the first metal plate, a second terminal conductor directly connected to the second metal plate so that current does not substantially flow through the first and second thick film conductors, and solders respectively disposed for connections between the first thick film and the first metal plate, between the second thick film conductor and the second metal plate, between the second metal plate and the semiconductor element, between the first metal plate and the first terminal conductor, and between the second metal plate and the second terminal conductor.

\* \* \* \* \*